(12) United States Patent
Alias et al.

(10) Patent No.: US 9,484,610 B2
(45) Date of Patent: Nov. 1, 2016

(54) PROCESSES FOR FORMING WAVEGUIDES USING LTCC SUBSTRATES

(71) Applicant: TELEKOM MALAYSIA BERHAD, Kuala Lumpur (MY)

(72) Inventors: Rosidah Alias, Selangor (MY); Sabrina Mohd Shapee, Selangor (MY); Mohd Zulfadli Mohamed Yusoff, Bandar Baru Bangi (MY)

(73) Assignee: Telekom Malaysia Berhad, Kuala Lumpur (MY)

( * ) Notice: Subject to any disclaimer, the term of this patent is extended or adjusted under 35 U.S.C. 154(b) by 0 days.

(21) Appl. No.: 14/960,433

(22) Filed: Dec. 6, 2015

(65) Prior Publication Data

US 2016/0087325 A1  Mar. 24, 2016

Related U.S. Application Data

(63) Continuation-in-part of application No. 14/135,376, filed on Dec. 19, 2013, now Pat. No. 9,168,731.

(30) Foreign Application Priority Data

Dec. 20, 2012 (MY) .......................... PI 2012701229

(51) Int. Cl.
*H05K 3/40* (2006.01)
*H01P 3/00* (2006.01)
*H01P 11/00* (2006.01)
(Continued)

(52) U.S. Cl.
CPC ............... *H01P 3/003* (2013.01); *B41F 15/00* (2013.01); *B41F 15/26* (2013.01); *B41F 15/36* (2013.01); *B41F 15/44* (2013.01); *H01P 11/003* (2013.01); *H05K 3/1233* (2013.01); *H05K 3/4629* (2013.01); *B41P 2215/50* (2013.01); *H05K3/1225* (2013.01); *H05K 3/4638* (2013.01); *H05K 2203/0139* (2013.01)

(58) Field of Classification Search
CPC ............ H05K 3/1225; H05K 3/1233; H05K 3/4638; H05K 3/4667; H05K 3/4611; H05K 3/4629
USPC .................................................. 101/126, 129
See application file for complete search history.

(56) References Cited

U.S. PATENT DOCUMENTS 4,604,298 A  8/1986 Shevtchuk et al.
4,817,524 A  4/1989 Riemer
(Continued)

FOREIGN PATENT DOCUMENTS

CN  101188260 A  5/2008
CN  101777413 A  7/2010

*Primary Examiner* — Leslie J Evanisko
(74) *Attorney, Agent, or Firm* — Pyprus Pte Ltd

(57) ABSTRACT

Processes for forming waveguides (200) using multiple co-planar layers of LTCC substrates (212, 212a, 212b) are described. Registration holes (222) on the substrates help align layering of the substrates. Arrays of circuit patterns are printed on each substrate, with each circuit being made up of conductor pattern (213) and/or via holes (224). Cavity alignment holes (226) formed around a periphery of each circuit allow alignment marks to be printed on the substrates for vision inspection. Similarly, circuit orientation holes (227) associated with each circuit allow orientation marks to be printed on the substrates to identify orientation of circuits in each finally formed waveguide. Substrate orientation holes (225) allow marks to be printed on one side of each substrate for alignment during screen printing. These in-process vision inspections and quality assurance tests allow product quality and process yields to improve.

11 Claims, 5 Drawing Sheets

(51) Int. Cl.
*B41F 15/00* (2006.01)
*B41F 15/26* (2006.01)
*B41F 15/36* (2006.01)
*B41F 15/44* (2006.01)
*H05K 3/12* (2006.01)
*H05K 3/46* (2006.01)

(56) References Cited

U.S. PATENT DOCUMENTS

| | | |
|---|---|---|
| 5,448,948 A | 9/1995 | Somers et al. |
| 5,699,733 A | 12/1997 | Chang et al. |
| 6,945,167 B2 | 9/2005 | Maeda et al. |
| 7,908,964 B2 | 3/2011 | Yamasaki et al. |
| 7,930,974 B2 | 4/2011 | Nakatani et al. |
| 2005/0205196 A1* | 9/2005 | Nozaki ............... H01L 21/4857 156/89.11 |
| 2008/0272968 A1* | 11/2008 | Muller ................... H01Q 1/225 343/703 |
| 2014/0261027 A1* | 9/2014 | Saad ................... B41F 15/0818 101/126 |

\* cited by examiner

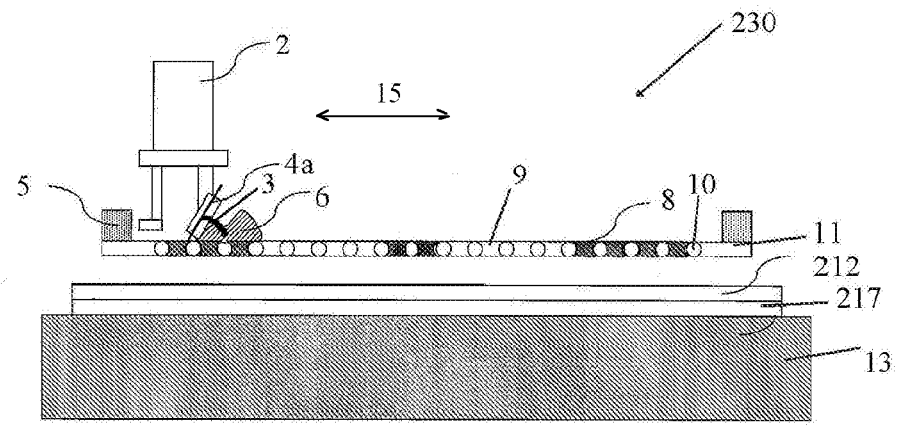
FIG. 4A
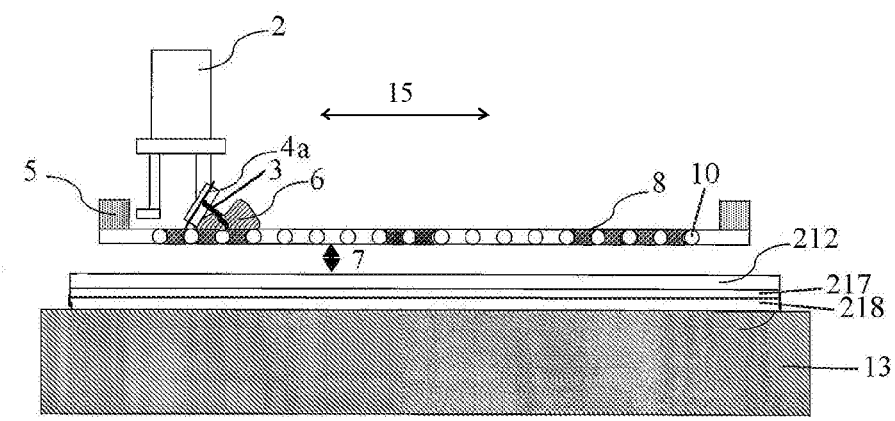
FIG. 4B
| Parameter | Value |
|---|---|
| Squeegee pressure | 0.05-0.15 MPa |
| Squeegee press-angle | 60° |
| Printing speed | 50-100 mm/s |
| Snap off | 0.8 - 1 mm |
FIG. 4C

PROCESSES FOR FORMING WAVEGUIDES USING LTCC SUBSTRATES

RELATED APPLICATIONS

This patent application is a continuation-in-part of patent application Ser. No. 14/135,376 filed on Dec. 19, 2013 (granted as U.S. Pat. No. 9,168,731), which claims benefits from Malaysian patent application number PI 2012701229, filed Dec. 20, 2012, and the disclosure of which is incorporated entirely.

FIELD OF INVENTION

The present invention relates to processes for forming waveguides using low temperature co-fired ceramic (LTCC) substrates. In particular, these waveguides are formed by layering co-planar patterns on LTCC substrates. These processes produce improved quality and yield, and the waveguides obtained have enhanced performance and reliability.

BACKGROUND

Off-set screen printing form thick-film prints comprising ink, paste, or the like on the surface of a substrate using a printing plate (screen mesh); one such type of off-set screen printing is the so-called silk screen printing, which is used to form fine patterns at high production rates; hence, it is utilized in a wide variety of industrial fields.

In the field of electronic parts production, screen printing method has been employed from the points of both precision and mass-production. In this field, the demand for forming finer print patterns with high precision has steadily increased due to recent development of technology to miniaturize the sizes of electronic parts.

LTCC is now a popular technology for manufacturing high-frequency circuits and is used advantageously to print 3-D circuits within a ceramic block by enabling integration of passive elements such as resistors, inductors and capacitors with fine conductor patterns. This LTCC approach also allows a number of interfaces and the reduction of the overall substrate size. LTCC technology utilizes highly conductive metal and has a low dielectric constant, low surface roughness, low sintering temperature, and good thermal properties.

Standard screen printing technology has also been principally developed for hybrid circuit manufacturing. Hybrid circuits are electronic modules printed on ceramic substrates, a technology in between semiconductor integration and discrete realization on PCB technology, and they are commonly used when electronic modules have to meet high technical requirements. The advantages of screen printing technology are well known: versatility in the conception, miniaturization, and mass production at low cost. The thick film components are produced by screen printing of conductive, resistive, and dielectric layers in order to form passive components on an LTCC substrate. Fine line printing is used to achieve high-component density. Therefore, it is important to control each screen printing parameter to improve on the quality of components and the yield of the circuit.

In general, screen printing is the basic technology for thick-film micro-circuitry. Many variables will affect the screen printing process. For example, the setting of the screen printer is a manual operation, and the quality of screen printed thick-film strongly depends on the operator and the process variables. The parameter settings affect directly the desired thickness and uniformity of the pastes printed on the substrates.

U.S. Pat. No. 6,945,167, assigned to Matsushita Electric, discloses a screen printing apparatus and method. It discloses that the print parameter settings include a squeegee movement speed, a printing pressure, and plate release conditions. The squeegee movement speed is set at the first step, then a printing pressure for realizing a desired cream solder charging state is set at the second step, and then plate release conditions for realizing a desired cream solder transfer state is set at the third step. It does not mention firing, baking, or heating of ceramic printed board, and there is no mention of LTCC or green tape.

U.S. Pat. No. 4,817,524, assigned to Boeing, discloses a method for screen printing, drawing a contact edge of a squeegee on the screen in a feed stroke such that a layer of paste is deposited on the screen, and then drawing the squeegee over the screen in a print stroke with the contact edge in contact with the screen so that the paste is forced through the screen onto the substrate. It does not mention LTCC or ceramic printed board.

U.S. Pat. No. 5,699,733, assigned to the Industrial Technology Research Institute, discloses a process that requires firing at low temperature, i.e., 500-600° C. However, the process is directed to increase paste layer thickness by subsequent repeated layering up to 6 layers. There is no mention of 3-D circuit or interconnecting circuit layers as required in an LTCC process.

U.S. Pat. No. 5,448,948, assigned to Delco Electronics Corp, discloses a screen printing device for screen printing a thick-film paste through a screen so as to form a substantially void-free film on a surface of a microelectronics circuit. It is limited to squeegee design.

U.S. Pat. No. 4,604,298, assigned to Gulton Industries, Inc, is directed to the viscosity of conductive paste compound, a high-viscosity gold alloy, firing at 800-900° C. However, there is no mention of ceramics and no mention of 3-D circuitry or embedding of components.

U.S. Pat. No. 7,930,974, assigned to Mitsubishi Electric Corp, discloses vacuum suction holes for affixing a substrate to be printed. There is no mention of green tape or ceramic being made. Baking is disclosed for electrode material to form electrodes.

U.S. Pat. No. 7,908,964, assigned to Panasonic Corp, discloses specifically to the clearance gap between the screen mask and substrate. There is no mention of ceramic firing, baking, or application for LTCC green tape.

Chinese Patent No. 101188260, issued to Shanghai Univ., et al, discloses an LTCC process for fabricating a square or circular cavity as a base for a high-powered LED to be formed on the LTCC layer prior to screen printing. There is no mention of any process control parameters for screen printing.

Chinese Patent No. 101777413, issued to Shenzen Sunlord Electronics, discloses a process for forming an LTCC power inductor comprising ferrite magnetic core; it mentions the advantages of high-frequency ceramic material and thinner (finer or higher resolution) screen print lines besides other benefits such as less conductor loss, low dielectric constant, better coefficient of heat conductivity and better exothermic property. The process control parameters disclosed here are applicable for a very specific type of device, i.e., for an LTCC power inductor.

It can thus be seen that there exists a need for improving the processes for forming co-planar waveguides using LTCC substrates.

SUMMARY

The following presents a simplified summary to provide a basic understanding of the present invention. This summary is not an extensive overview of the invention, and is not intended to identify key features of the invention. Rather, it is to present some of the inventive concepts of this invention in a generalised form as a prelude to the detailed description that is to follow.

The present invention seeks to provide an improved method for manufacturing waveguides or antennae by stacking multiple layers of LTCC substrates. The LTCC are screen printed with circuit and via patterns. Alignment during stacking the LTCC substrates is crucial to obtaining good quality waveguides and high yield in the manufacturing process. In-process vision inspections and quality control also allow quality and yields of the processes to be attained and maintained.

In one embodiment, the present invention provides a process for forming a waveguide using multiple layers of low temperature co-fired ceramic (LTCC) substrates and screen printing. The process comprising: forming a screen printing mask to comprise registration openings that correspond to a predetermined number of spaced apart registration holes located on each sheet of LTCC substrate; placing the screen printing mask over each LTCC substrate and adjusting a printing table of an associated screen printing machine so that the registration openings on the printing mask align with the corresponding spaced apart registration holes on the LTCC substrate; printing circuit patterns by passing and depositing conductor paste through the screen printing mask onto each of the LTCC substrate, and allowing the printed conductor paste to dry in an oven; and stacking up multiple layers of the LTCC substrates with printed circuit patterns by building layers of the LTCC substrates on a stacking machine, wherein registration pins in the stacking machine align the registration holes on separate layers of the LTCC substrates with one another.

In-process inspection of depositing conductor paste under UV lighting or X-ray imaging allows continuous monitoring of quality and yield of the waveguide forming process.

In an aspect, the circuit pattern comprises an array of circuit patterns. The process further comprises forming cavity openings along peripheries of each circuit pattern in the array, so that cavity alignment marks printed on each substrate allow vision inspection to determine or monitor quality and yield of the waveguide forming process.

In another aspect, the process further comprises forming orientation openings in the printing mask to print a circuit orientation mark in each circuit pattern, so that orientation of the circuit pattern can be identified in a finally formed waveguide.

In another aspect, the process further comprises forming a substrate orientation opening in the printing mask to print a substrate orientation mark on each LTCC substrate. The substrate orientation mark allows alignment of the substrate in relation to an associated screen printing mask.

In another embodiment, the process further comprises disposing the stacked up LTCC substrates on a centre plate of the stacking machine, placing the stacked up LTCC substrates with the centre plate into a vacuum bag, vacuum sealing the vacuum bag and allowing the LTCC substrates to bond together in an oven. The sealed vacuum bag and contents are disposed in a laminating machine. The laminating machine is preheated for a predetermined preheat time, working pressure increased to substantially 21 MPa after the preheat time and holding the laminating pressure for a predetermined set time. The stacked up LTCC substrates are then moved a cutting machine and the circuit patterns are diced along the peripheries to produce individual blocks. The diced LTCC substrates are then fired in a vacuum furnace to fuse the substrates together and each block forms an individual waveguide.

In another embodiment, the present invention provides a system for manufacturing waveguides according to the processes of the present invention.

BRIEF DESCRIPTION OF THE DRAWINGS

This invention will be described by way of non-limiting embodiments of the present invention, with reference to the accompanying drawings, in which:

FIGS. 4A and 4B illustrate schematics of the screen printing machine for use with the process shown in FIG. 1A, whilst FIG. 4C lists some parameters of the screen printing machine.

DETAILED DESCRIPTION

Figure 1A:
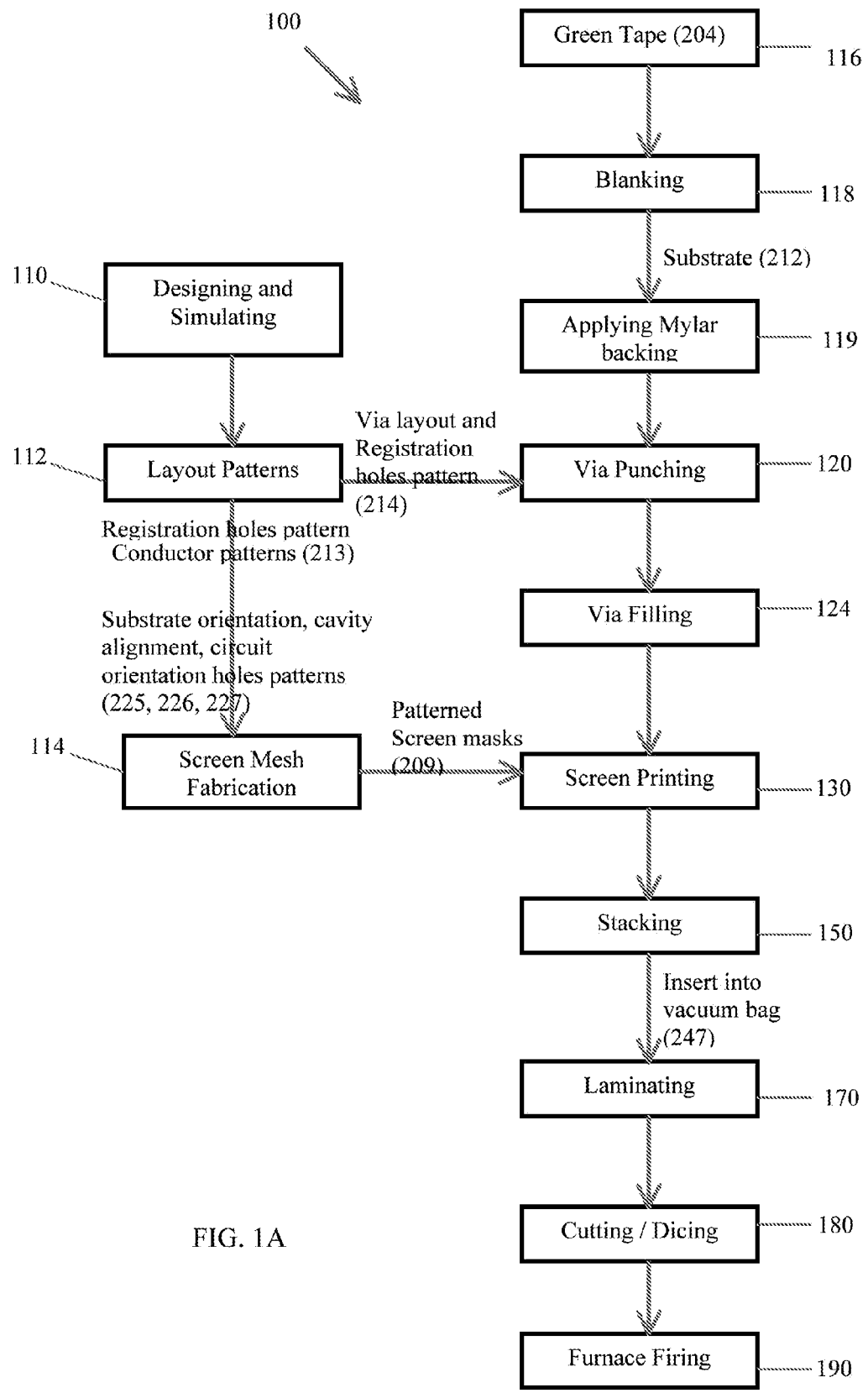
FIG. 1A illustrates a process for manufacturing a waveguide using coplanar LTCC substrates according to an embodiment of the present invention, whilst FIG. 1B graphically depicts the process

One or more specific and alternative embodiments of the present invention will now be described with reference to the attached drawings. It shall be apparent to one skilled in the art, however, that this invention may be practised without such specific details. Some of the details may not be described at length so as not to obscure the invention. For ease of reference, common reference numerals or series of numerals will be used throughout the figures when referring to the same or similar features common to the figures.

Figure 1B:
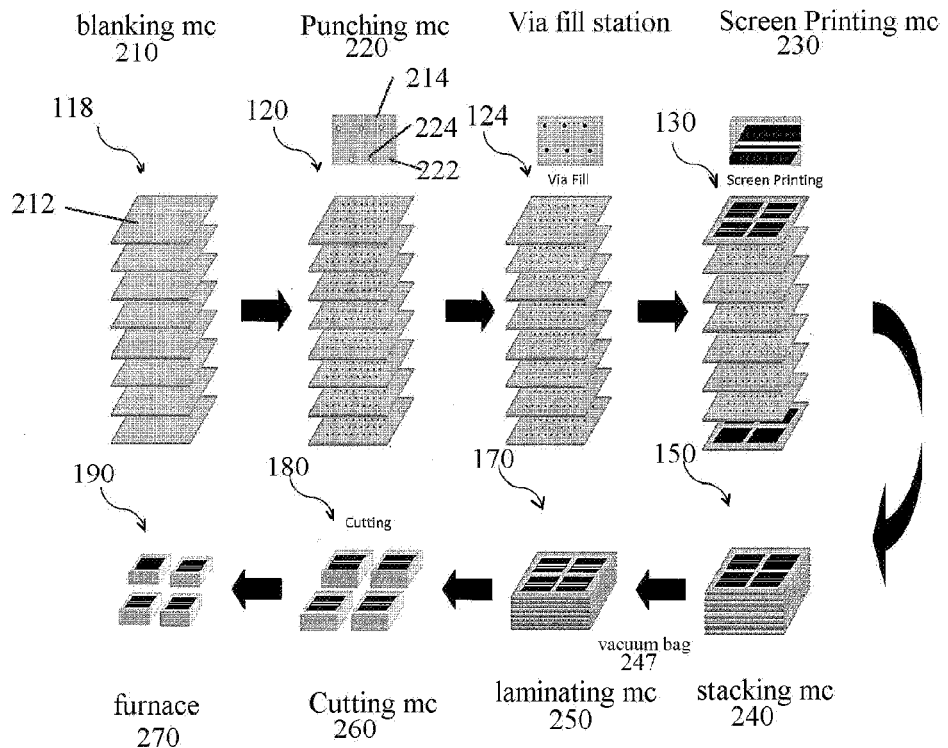
FIG. 1C illustrates a section of the waveguide obtained by the process.
Figure 1C:
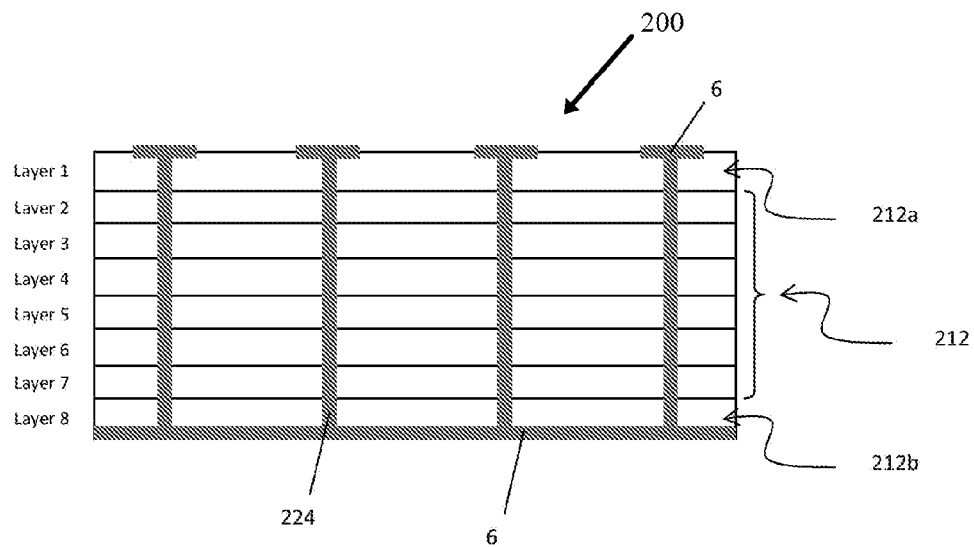

The present invention is exemplified in a process 100 of forming waveguides using coplanar LTCC substrates. Patterns are screen printed on the LTCC substrates; the printed LTCC substrates are then stacked up, cured in an oven, vacuum sealed and laminated, cut into individual blocks and fired in a vacuum furnace; the blocks of the LTCC substrates are used to configure giga-hertz waveguides or antennae 200 with enhanced performance and reliability. FIG. 1A shows the process 100 of fabricating waveguide using coplanar LTCC substrates whilst FIG. 1B shows the process flow in graphics. FIG. 1C shows a section of the waveguide 200 obtained by the process 100. As shown in FIG. 1A, details of the layered waveguide 200 are designed and simulated, in step 110. For example, softwares such as, EMPIRE and MultiLib are used to design and simulate conductor layout patterns 213. A CAD software, such as AutoCAD, is used to draw registration holes and via holes layout patterns 214. In step 112, the conductor patterns 213 are transferred to a screen mesh fabrication station, whilst the registration-via holes patterns 214 are transferred to a punching machine 220. In the screen mesh fabrication station, the conductor pattern 213 of each layer of the layered waveguide 200 is transferred, in step 114, to mask a photosensitive emulsion 8 that has been coated on the wire mesh 10 of a mesh screen 11 of a screen printing machine 230 for screen printing 130 the patterns on the LTCC substrates 212. The photosensitive emulsion 8 is then exposed to UV light through each associated conductor pattern 213. After washing, the UV cured emulsion forms a negative printing mask with pattern openings 9 that correspond to the conductor pattern 213, via holes 224 pattern and other alignment/orientation holes 225, 226, 227 which are described in the next paragraph. For easy reference, the patterned printing masks are now denoted by numeral 209.

Figure 2A:
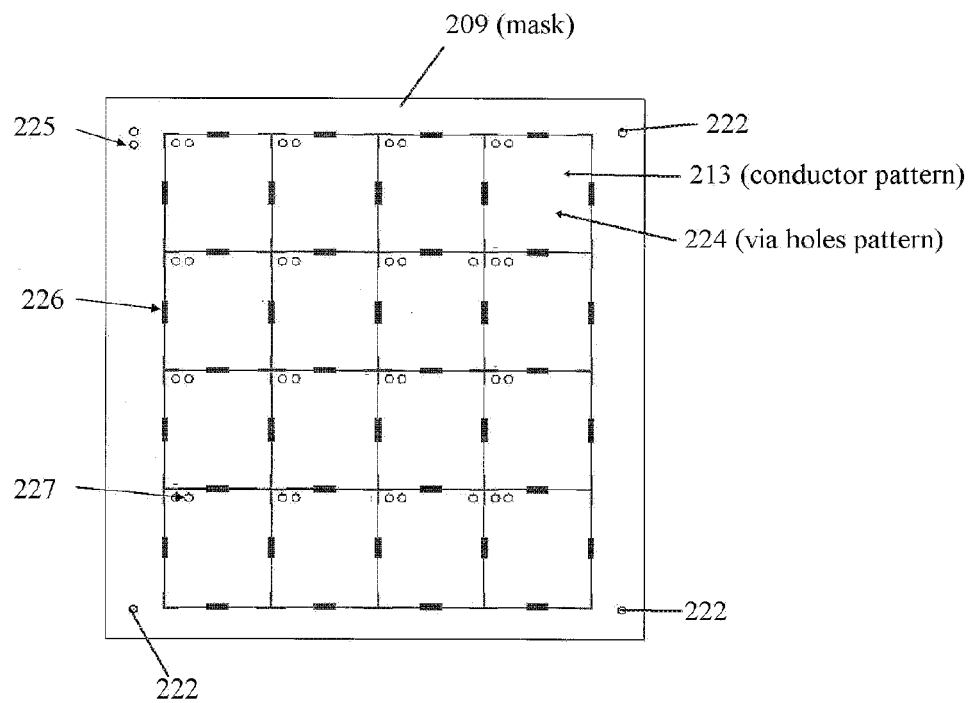
FIG. 2A illustrates a screen mask for use in the process shown in FIG. 1A, whilst
Figures 2B, 2C:
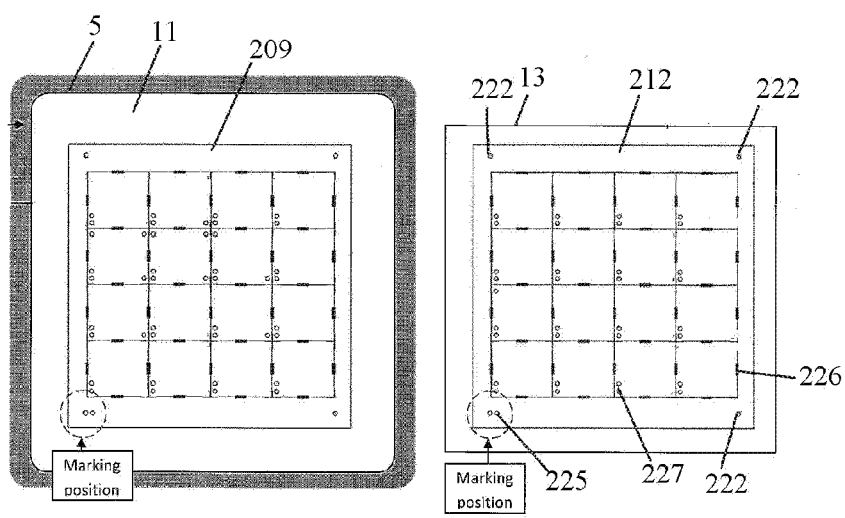
FIG. 2B illustrates a mesh screen and FIG. 2C illustrates a printed LTCC substrate obtained by using the mesh screen shown in FIG. 2B.

In addition to the registration-via holes pattern 214, the CAD software is also used to draw additional substrate orientation holes 225, cavity alignment holes 226 and circuit orientation holes 227. As will be described, layout of these substrate orientation holes 225, cavity alignment holes 226 and circuit orientation holes 227 are also sent to the screen mesh fabrication station and these alignment/orientation holes form parts of the patterned printing masks 209. As will be appreciated, the substrate orientation holes 225 are located in each of the patterned printing mask 209 corresponding to a fourth corner of the substrate 212 that is without the registration hole 222; for illustration, two substrate orientation holes 225 are shown in the figures. As will also be appreciated, the cavity alignment holes 226 are formed as rectangular openings along a periphery surrounding each unit of circuit making up an array of the conductor patterns 213. These substrate orientation holes 225, cavity alignment holes 226 and circuit orientation holes 227 are shown as part of the patterned printing mask 209 in FIG. 2A.

Now referring back to FIGS. 1A and 1B, rolls of green LTCC tapes 204 are fed, in step 116, into a blanking machine 210. In one embodiment, the blanking machine 210 includes a platen with blade cutters embedded on the platen. After blanking, the tapes 204 are cut, in step 118, for example, into substrates 212 of A4 size (210 mm by 297 mm). A Mylar backing sheet 217 is then attached, in step 119, onto each of the cut substrate 212 by means of a pressure sensitive adhesive (PSA). The substrate 212 with Mylar backing 217 is then transferred to various machines or stations for further processing. The Mylar backing sheet 217 serves as a carrier and prevents the soft, green substrate 212 from being stretched and distorted during mechanical handling and transportation to the punching machine 220, via filling station, ovens, printing machine 230 and stacking machine 240. In another embodiment, the substrate 212 with Mylar backing 217 is additionally attached onto a carrier plate 218. The substrate with Mylar backing on the carrier plate 218 is disposed on the printing table 13 of the screen printing machine 230, as shown in FIG. 4B. The LTCC substrates 212 are not limited to A4 size, but it depends on the size of the printing table 13 of the screen printing machine 230 to be used.

In step 120, each of the substrate 212 with the Mylar backing 217 is transferred to the punching machine 220, such as KEKO pin-punch model PAM-4S. According to the registration holes-via holes pattern 214, each substrate 212 is punched with three registration holes 222, with each registration hole being located at each of three corners of the substrate 212. The significance of the registration holes will be appreciated when a substrate stacking process is described. Some of the substrates 212 are also punched with via holes 224 for forming electrical inter-connections between layers of the substrates. In one embodiment, the registration holes 222 are substantially 3 mm diameter, whilst the via holes 224 are 200 microns diameter.

Figure 3A:
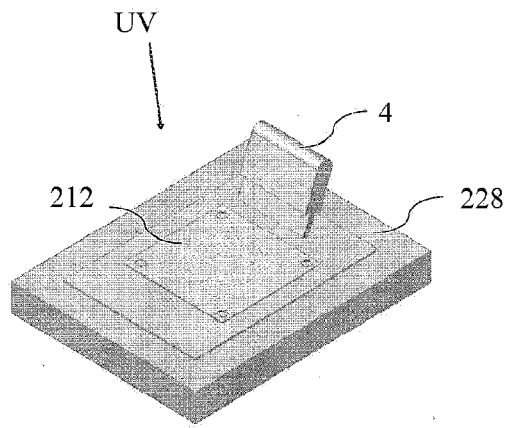
FIG. 3A illustrates a schematic of via hole filling station, whilst

Next, in step 124, the substrates 212 with via holes 224 are transferred one at a time to a via filling station. As shown in FIG. 3A, at the via filling station, an electric conductor paste 6 (shown in FIG. 4A) is applied on each substrate 212 and a squeeze 4 is used to manually fill the via holes 224 under UV lighting. The via holes 224 are filled up by carefully and uniformly stroking the squeeze to ensure that the via holes 224 are filled up completely with the electric conductor paste 6. Under UV lighting, quality assurance and determination of complete via filling is made easy. During via filling, care is noted on the squeeze pressure, squeeze speed and squeeze angle to the substrate. In one embodiment, the electrically conductive paste 6 is a ferro silver via fill paste CN 33-407 supplied by Ferro Corporation. In another embodiment, an X-ray box 228 is disposed below the substrate 212 and additional quality assurance and determination of complete via filling can be performed before the process 100 proceeds further. The substrates with filled via holes are then transferred to an oven where the electric conductor paste 6 is dried at a temperature of about 70 degree C. for about 5-10 minutes. To exemplify the present invention, six of such substrates 212 with filled via holes 224 are used to fabricate a waveguide 200. These six substrates 212 with conductor filled via holes 224 are then sandwiched between a top substrate 212a and a bottom substrate 212b, as shown by a sectional view of the waveguide in FIG. 1C. For ease of description, the top and bottom substrates 212a, 212b are assumed to be screen printed 130 with the same conductor patterns 213. In another embodiment, some or all of the six substrates 212 with conductor filled via holes 224 are also screen printed 130, for example, with other conductor patterns according to circuit design of the waveguides to be manufactured. The screen printing process is now described:

FIG. 4A is a schematic of the screen printing machine 230 for screen printing 130 the conductor patterns 213 onto the top substrate 212a, bottom substrates 212b and substrates 212 with conductor filled via holes. As is well known, the LTCC technology is used to produce multilayer circuits. In other embodiments, sheets of LTCC substrates are screen printed 130 with conductive, dielectric, and/or resistive pastes; these sheets are then stacked up, laminated together and fired in one step. This saves time and money and produces fine circuit lines and line spacings. With low firing temperature of about 850 degree C., it is possible to use low resistive materials, such as silver and gold, instead of molybdenum and tungsten.

In one embodiment, the screen printing machine 230 is a KEKO screen printer model P-200Avf. The above screen printing machine 230 comprises: a printing table 13 having suction holes (not shown in the figures) to hold the LTCC substrate 212, 212a, 212b via the Mylar backing 217; at least one print station includes a support suitable for receiving a mesh screen 11, and a translation means for moving the support. The mesh screen 11 comprises a frame 5, a wire mesh 10, and a squeegee head 2 that is moveable along the support. The wire mesh 10 is made of fine woven stainless steel wires. The mesh screen 11 with pattern openings 9 (obtained in step 114) is positioned on the printing table 13 in the screen printing machine 230, so that the centre of the mesh screen 11 falls within X-Y adjustment limits to the centre of the printing table 13; these X-Y adjustment limits are inherent to the printing machine 230. Conductor paste 6 is placed on the mesh screen 11 and one of the substrate 212 is placed directly under the mesh screen 11. A squeegee 4a is moved across the mesh screen 11 at a predetermined angle 3, speed 15, pressure, and a snap-off distance 7 between the mesh screen 11 and the LTCC substrate. Preferably, the squeegee 4a does not spread the conductor paste 6 to the registration holes 222. After each of the LTCC substrate 212, 212a, 212b with a Mylar backing 217 is loaded on the printing table 13, vision alignment is done to ensure that the substrate 212, 212a, 212b is aligned with the patterned mask 209, ie. by aligning openings on the patterned mask corresponding to the registration holes 222 with the registration holes 222 formed through the thickness of the substrates 212, 212a, 212b. This alignment process is crucial for manufacturing this multi-layered waveguide 200. The screen printing process is then carried out after all the parameters are set and vision alignment is completed. In addition, after screen printing, the prints on the substrate 212, 212a, 212b corresponding to the cavity alignment holes 226 can be vision inspected to ensure that the printed circuit patterns are located within tolerances from the registration holes 222; this would ensure that the circuit patterns on stacked-up substrates 212, 212a, 212b are within predetermined vertical alignment limits; the circuits in the array that fail the vision alignment inspection may be recorded and identified as rejects; the above vision alignment inspection would ensure that good product quality and process yields are maintained.

After the conductor patterns 213, including the prints corresponding to the substrate orientation holes 225, cavity alignment holes 226 and circuit orientation holes 227, are formed on the substrates 212, 212a, 212b, each of the printed substrate is moved into an oven, and the printed conductor paste 6 is allowed to dry at about 70 degree C. for about 10 minutes.

Figure 3B:
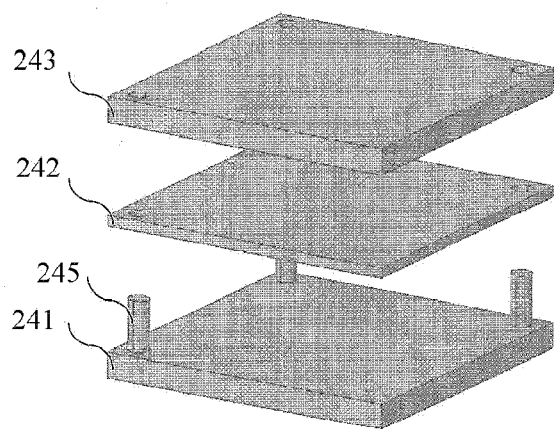
FIGS. 3B and 3C illustrate plates of a stacking machine for use with the process shown in FIG. 1A.
Figure 3C:
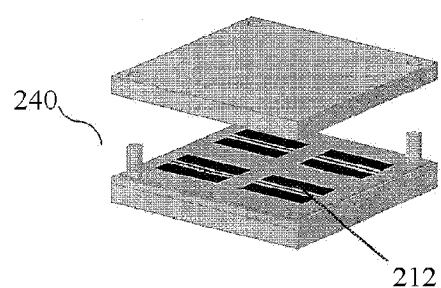

Referring back to FIGS. 1A and 1B, the process 100 has now reached step 150. In step 150, the LTCC substrates 212, 212a, 212b with printed conductor lines and conductor filled vias are stacked up using a stacking machine 240, as shown schematically in FIGS. 3B and 3C. The stacking machine 240 is made up of a base plate 241, a centre plate 242 and a top plate 243. The base plate 241 has three registration pins 245, which are shaped and spaced apart according to the layout of the registration holes 222. Corresponding to the registration pins 245 are three holes formed in each of the centre and top plates to receive the registration pins 245. Preferably, the top plate 243 is relatively thicker and heavier than the centre plate 242. Preferably, the base plate 241 is also relatively thick. To begin the stacking step 150, the centre plate 242 is guided by the registration pins 245 to rest on the base plate 241. The bottom LTCC substrate 212b is then placed onto the centre plate 242 by aligning the registration holes 222 through the registration pins 245 with the Mylar backing 217 facing up. The Mylar backing 217 is then carefully peeled off, and the next LTCC substrates 212 are sequentially mounted one on top of another until all the eight layers of LTCC substrates are aligned and stacked-up. The top plate 243 is then added on top of the upper LTCC substrate 212a by guiding the top plate 243 through the registration pins 245. The top plate 243, being relatively heavier than the centre plate, provides a light pressure on the stacked-up substrates 212, 212a, 212b. The entire stacking machine 240 is then moved into an oven, which is set to about 70 degree C. for about 5-10 minutes to bond the stacked-up substrates together. After the entire stacking machine 240 is retrieved from the oven, the top plate 243 is removed. The centre plate 242 together with the stacked-up substrates are then separated from the base plate 241. An additional quality inspection step may be performed by testing the interlayer electric conductivity, for example, by using a resistance meter or a multi-meter. The circuits in the array which fail the electric conductivity tests are recorded and identified as rejects.

After the interlayer electric conductivity inspection, the centre plate 242 and the stacked-up substrates are placed into a vacuum bag 247, which is then evacuated and sealed. The sealed stacked-up substrates together with the centre plate 242 are then moved into an isostatic laminating machine 250. The laminating machine 250 is set to a temperature of about 70 degree C. and a pressure of about 21 MPa. In use, the laminating machine 250 may be set at a preheat temperature for about 10 minutes followed by setting the working laminating temperature and pressure for about 10 minutes. This completes the laminating step 170 shown in FIG. 1A.

After the stacked-up substrates are laminated, the component layers (as seen in FIG. 1C) are bonded together but the LTCC substrates remain soft enough for cutting or dicing, in step 180, into individual blocks with each block containing circuits for configuring into an individual waveguide 200. In one embodiment, a hot blade cutting machine 260 is used for dicing the LTCC substrates into individual blocks. The diced blocks of LTCC substrates are then placed, in step 190, in a vacuum furnace 270 for firing the ceramic material. In one embodiment, the vacuum furnace 270 uses quartz heaters to fire up the furnace to about 850 degree C. After furnace firing, the layered LTCC substrates become fused together.

In the present invention, the screen printing parameters follow substantially those described in the parent application Ser. No. 14/135,376. FIG. 4C lists some parameters of the screen printing machine 230. However, in the present invention, the conductor line and spacing widths are allowed to increase to 150 microns.

While specific embodiments have been described and illustrated, it is understood that many changes, modifications, variations and combinations thereof could be made to the present invention without departing from the scope of the invention. For example, the stacked-up substrates have been described by building upwards from the bottom substrate 212b; the effects of this invention are not changed by layering the stacked-up substrates from the top substrate 212a. In another example, three registration holes 222 are formed on each LTCC substrate; it is possible that only two registration holes are provided and used in the present invention, preferably with the registration holes being spaced apart. Also, the LTCC substrates are not limited in shape and size as described above. The above LTCC manufacturing process is also not limited to forming conductor lines and vias, and may include other circuit elements.

What is claimed is:

1. A process for forming a waveguide using multiple layers of low temperature co-fired ceramic (LTCC) substrates and screen printing, the process comprising:
   forming a screen printing mask to comprise registration openings that correspond to a predetermined number of spaced apart registration holes located on each of the multiple layers of LTCC substrates;
   placing the screen printing mask over each LTCC substrate and adjusting a printing table of an associated screen printing machine so that the registration openings on the printing mask align with the corresponding spaced apart registration holes on the LTCC substrate;
   printing circuit patterns by passing and depositing conductor paste through the screen printing mask onto each of the LTCC substrate, and allowing the printed conductor paste to dry in an oven; and
   stacking up multiple layers of the LTCC substrates with printed circuit patterns by building layers of the LTCC substrates on a stacking machine, wherein registration pins in the stacking machine align the registration holes on separate layers of the LTCC substrates with one another.

2. The process according to claim 1, wherein depositing the conductor paste through the screen printing mask is carried out under ultra-violet (UV) lighting.

3. The process according to claim 1, wherein depositing the conductor paste through the screen printing mask is followed by taking an X-ray image with an X-ray box.

4. The process according to claim 1, wherein each of the circuit patterns comprises an array of circuit patterns, further comprising forming cavity openings along peripheries of each circuit pattern in the array, so that cavity alignment marks printed on each LTCC substrate allow vision inspection to determine or monitor quality and yield of the waveguide forming process.

5. The process according to claim 4, further comprising forming orientation openings in the printing mask to print a circuit orientation mark in each circuit pattern in the array.

6. The process according to claim 4, further comprising forming a substrate orientation opening in the printing mask to print a substrate orientation mark on each LTCC substrate.

7. The process according to claim 1, further disposing the stacked up LTCC substrates on a centre plate of the stacking machine, placing the stacked up LTCC substrates with the centre plate into a vacuum bag, vacuum sealing the vacuum bag and allowing the LTCC substrates to bond together in an oven.

8. The process according to claim 7, further comprising disposing the sealed vacuum bag and contents in a laminating machine, preheating the laminating machine for a predetermined preheat time, increasing pressure of the laminating machine to substantially 21 MPa after the preheat time and holding the laminating pressure for a predetermined set time.

9. The process according to claim 8, further comprising retrieving the stacked up LTCC substrates from the laminating machine, dicing the stack of LTCC substrates on a cutting machine along the peripheries of the circuit patterns to produce individual blocks.

10. The process according to claim 9, further comprising disposing the individual blocks of LTCC substrates in a vacuum furnace to fire blocks of the LTCC substrates.

11. The process according to claim 7, further comprising testing electric conductivity of selected circuit patterns across layers of the LTCC substrates before vacuum sealing.

* * * * *